US008163443B2

(12) United States Patent
Tomari et al.

(10) Patent No.: US 8,163,443 B2
(45) Date of Patent: *Apr. 24, 2012

(54) PHOTOSENSITIVE RESIN COMPOSITION FOR VOLUME PHASE HOLOGRAM RECORDING AND OPTICAL INFORMATION RECORDING MEDIUM USING THE SAME

(75) Inventors: Kouhei Tomari, Kitakyushu (JP); Yasuji Shichijo, Kitakyushu (JP)

(73) Assignee: Nippon Steel Chemical Co., Ltd., Tokyo (JP)

(*) Notice: Subject to any disclaimer, the term of this patent is extended or adjusted under 35 U.S.C. 154(b) by 663 days.

This patent is subject to a terminal disclaimer.

(21) Appl. No.: 12/224,598

(22) PCT Filed: Mar. 5, 2007

(86) PCT No.: PCT/JP2007/054204
§ 371 (c)(1),
(2), (4) Date: Oct. 27, 2008

(87) PCT Pub. No.: WO2007/102470
PCT Pub. Date: Sep. 13, 2007

(65) Prior Publication Data
US 2009/0130568 A1    May 21, 2009

(30) Foreign Application Priority Data
Mar. 9, 2006    (JP) .................... 2006-064110

(51) Int. Cl.
    G03H 1/02    (2006.01)
(52) U.S. Cl. .............. 430/2; 430/1; 430/280.1; 359/3
(58) Field of Classification Search .............. None
    See application file for complete search history.

(56) References Cited

U.S. PATENT DOCUMENTS

| 3,993,485 | A | 11/1976 | Chandross et al. |
| 5,759,721 | A | 6/1998 | Dhal et al. |
| 5,986,020 | A * | 11/1999 | Campbell et al. ............ 526/64 |
| 6,124,076 | A | 9/2000 | Dhar et al. |
| 6,784,300 | B2 | 8/2004 | Cetin et al. |
| 8,034,514 | B2 * | 10/2011 | Tomari et al. ................ 430/1 |
| 2004/0126696 | A1 * | 7/2004 | Inomata et al. ........ 430/270.1 |
| 2005/0256285 | A1 * | 11/2005 | Mori et al. ................. 526/346 |
| 2006/0177666 | A1 * | 8/2006 | Kawabe .................. 428/411.1 |
| 2006/0188940 | A1 * | 8/2006 | Cima et al. ................. 435/7.1 |
| 2007/0129502 | A1 * | 6/2007 | Kawabe et al. ............ 525/391 |
| 2009/0053615 | A1 * | 2/2009 | Tomari et al. ............... 430/2 |
| 2010/0203429 | A1 * | 8/2010 | Tomari et al. ............... 430/2 |

FOREIGN PATENT DOCUMENTS

| JP | 01-263646 | 10/1989 |
| JP | 05-094014 | 4/1993 |
| JP | 09-106242 | 4/1997 |
| JP | 2000-086914 | 3/2000 |
| JP | 2001-282082 | 10/2001 |
| JP | 2004-123873 | 4/2004 |
| WO | 2006/095610 | * 9/2006 |

OTHER PUBLICATIONS

Satoh et al., Direct living cationic polymerization of p-hydroxystyrene with boron trifluoride etherate in the presence of water, Macromol. vol. 33 pp. 5405-54-10 (2000).*
Deleuze et al., "Polymer supported titanates as catalysts for transesterification reactions", Polymer vol. 39(22) pp. 6109-6114 (Nov. 1998).*
Lei et al., "Dissolution rates of co-polymers based upon 4-hydroxystyrene and styrene", in Polymers for microelectronics ACS symposium Series, pp. 111-123 (1993).*
Satoh, Kotaro et al., "Novel $BF_3OEt_2$/R-OH Initiating System for Controlled Cationic Polymerization of Styrene in the Presence of Water," Marcomolecules 2001, 34, pp. 396-401.
International Search Report mailed Jun. 12, 2007, issued on PCT/JP2007/054204.
Notification Concerning Transmittal of International Preliminary Report on Patentability (Chapter I of the Patent Cooperation Treaty) (1 sheet).
International Preliminary Report on Patentability (Chapter I of the Patent Cooperation Treaty) (2 sheets).
Notification Concerning Transmittal of International Preliminary Report on Patentability (Chapter I or Chapter II of the Patent Cooperation Treaty) (2 sheets).
Written Opinion of the International Searching Authority (2 sheets).

* cited by examiner

*Primary Examiner* — Martin Angebrannt
(74) *Attorney, Agent, or Firm* — Edwards Wildman Palmer LLP; James E. Armstrong, IV; Junko Harada

(57) ABSTRACT

Disclosed is a volume phase hologram recording material characterized by excellent photosensitivity, low cure shrinkage, high transparency, and particularly good storage stability and also disclosed is a recording medium prepared therefrom. Further disclosed is a photosensitive resin composition for volume phase hologram recording that comprises a soluble aromatic copolymer (A), a photoradically polymerizable compound (B) capable of copolymerizing with the soluble aromatic copolymer (A), a photopolymerization initiator (C), and a polymer binder (D). The soluble aromatic copolymer (A) has a structural unit of a divinyl aromatic compound and a structural unit of a monovinyl aromatic compound, comprises 10 to 90 mol % of a structural unit represented by the following formula (a1), has a hydroxyl equivalent of 100 to 30,000 g/equiv, a number average molecular weight ($M_n$) of 400 to 30,000, and a molecular weight distribution ($M_w/M_n$) of 10 or less, and accounts for 5 to 60 wt % of the composition.

20 Claims, No Drawings ic resin composition for volume phase hologram recording which is photocured rapidly by an active energy ray (for example, a visible light laser, an ultraviolet ray, and an electron beam), excellent in hologram characteristics such as diffraction efficiency and resolving power, and formable into a thick film of excellent transparency and heat resistance and further relates to an information recording medium using said photosensitive resin composition.

PHOTOSENSITIVE RESIN COMPOSITION FOR VOLUME PHASE HOLOGRAM RECORDING AND OPTICAL INFORMATION RECORDING MEDIUM USING THE SAME

TECHNICAL FIELD

This invention relates to a photosensitive resin composition for volume phase hologram recording which is photocured rapidly by an active energy ray (for example, a visible light laser, an ultraviolet ray, and an electron beam), excellent in hologram characteristics such as diffraction efficiency and resolving power, and formable into a thick film of excellent transparency and heat resistance and further relates to an information recording medium using said photosensitive resin composition.

BACKGROUND TECHNOLOGY

Holograms have been used primarily in the fields of stereo image display and security. The materials mainly used for holograms in old times were wet-type photosensitive materials that required a process for development, for example, silver salt and dichromated gelatin. Recently, however, dry-type photopolymerizable hologram recording materials that require no process for development and show excellent environment resistance and light resistance after recording have become the mainstream. The mechanism for recording by a photopolymerizable hologram recording material differs from that for recording by a silver salt photosensitive material or dichromated gelatin and is generally considered as follows. When a recording material is irradiated with an interference pattern formed by interference of light of highly coherent nature (capable of displaying stable interference effects), the substances existing in the material and differing from one another in polymerization ability diffuse and migrate respectively to a bright part of the light (area of higher light intensity) and a dark part of the light (area of lower light intensity) to form a refractive index-modulated structure as the photopolymerization progresses, thereby recording a hologram. There are three modes of polymerization for the photopolymerizable hologram recording materials: (1) radical polymerization, (2) cationic polymerization, and (3) radical/cationic polymerization. Materials of the photoradical polymerization type are commonly used; however, they have a serious defect in that the shrinkage attributable to this particular mode of polymerization amounts to as high as several percents in spite of their high sensitivity.

In recent years, as a part of various activities organized toward realization of a ubiquitous information society, studies on the use of photopolymerizable hologram recording materials for holographic data storage have been renewed throughout the world and a variety of photopolymerizable hologram recording materials have been proposed. This situation is largely due to enormous progresses made in technologies relating to laser optical sources, spatial light modulators, and the like in the execution of the federal projects of the United States initiated in the mid-1990s such as HDSS (Holographic Data Storage System, 1995-1999) and PRISM (Photorefractive Information Storage Materials, 1994-1998). The conventional technology for recording data on an optical disk such as a CD and a DVD comprises condensing laser beams on a recording material through a lens and recording data on the material bit by bit. The data storage capacity that depends on the size of a spot of condensed beams has already reached the theoretical limit and a further increase in storage capacity would require novel technologies. It is holography that has attracted attention in recent years as one of the candidates for such technologies.

The holographic data storage can perform volume recording unlike plane recording in the case of CDs and DVDs and treats page data. For this reason, the holographic data storage can record a vast amount of data, far surpassing the conventional CDs and DVDs. Currently, developmental works on materials and recording technologies are in progress actively at research organizations aiming at putting to practical use of hologram optical disks of the WORM (Write Once Read Many) type that is capable of performing 1 TB (terabyte) recording. The concept for the basic design of materials for the holographic data storage is the same as for the aforementioned photopolymerizable hologram recording materials for use in stereo image recording and security. However, the materials for holographic data storage must satisfy extremely stringent requirements, in particular, the requirements for sensitivity to a light source to be used and cure shrinkage.

As described in patent documents 1 and 2, materials with controlled polymerization shrinkage are prepared by using CROP (Cationic Ring-Opening Polymerization) monomers having oxirane and oxetane rings and pre-photoirradiating them. In this case, cationic polymerization is affected less by oxygen inhibition than radical polymerization, but the sensitivity in a long-wavelength region somewhat deteriorates. On the other hand, patent document 3, 4, or 5 discloses the combined use of cyclohexene oxide and an expanding agent (a diphenylfurancarboxylic acid salt) in the preparation of a material whose polymerization shrinkage is as low as 1% or less. Although the cure shrinkage is suppressed here also by the use of a CROP monomer followed by whole-area exposure of the monomer before or after recording, no proposal is made on improvement of the sensitivity. Putting the holographic data storage to practical use would require a further increase in photosensitivity, a reduction in cure shrinkage, and an increase in heat resistance Patent document 1: U.S. Pat. No. 5,759,721
Patent document 2: U.S. Pat. No. 6,784,300
Patent document 3: U.S. Pat. No. 3,993,485
Patent document 4: U.S. Pat. No. 6,124,076
Patent document 5: JP2000-086914 A
Patent document 6: JP5-94014 A
Patent document 7: JP9-106242 A
Patent document 8: JP2004-123873 A
Non-patent document 1: Macromolecules, 34, 396-401 (2001)

Patent documents 6 and 7 describe a photosensitive resin composition for hologram recording formulated from a radically polymerizable ethylenic monomer, a photopolymerization initiator, and an epoxy resin. This composition utilizes the following phenomenon for forming a hologram; the radically polymerizable ethylenic monomer starts polymerizing preferentially from the bright part of an interference pattern at the time of exposure to laser beams and the ethylenic monomer migrates to the bright part. The epoxy resin is cured thereafter. Patent document 8 describes a soluble aromatic copolymer having a structural unit of a divinyl aromatic compound and a structural unit of a monovinyl aromatic compound, but contains no description on the use of the copolymer in holograms.

DISCLOSURE OF THE INVENTION

Problems to be Solved by the Invention

This invention has been completed under the aforementioned circumstances and an object of this invention is to provide a volume phase hologram recording resin composition that satisfies the requirements for diffraction efficiency, photosensitivity, resolving power, and heat resistance and particularly the requirement for storage stability in the event of its application to volume phase holograms. Another object is to provide an optical information recording medium to be obtained from said composition. It is to be noted that, in addition to the holographic data storage, the hologram obtained by this invention can be used in other applications where the usefulness of holograms is fully displayed, for example, diffraction gratings, interference filters, lens, and head-up displays.

Means to Solve the Problems

Accordingly, this invention relates to a photosensitive resin composition for volume phase hologram recording comprising: a soluble aromatic copolymer (A) that has a structural unit of a divinyl aromatic compound and a structural unit of a monovinyl aromatic compound, comprises 10 to 90 mol % of a structural unit represented by the following formula (a1)

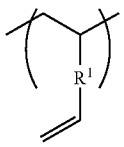

(a1)

where $R^1$ is an aromatic hydrocarbon group of 6 to 30 carbon atoms, and has a hydroxyl equivalent of 100 to 30,000 g/equiv, a number average molecular weight ($M_n$) of 400 to 30,000, and a molecular weight distribution ($M_w/M_n$) of 10 or less; a photoradically polymerizable compound (B) capable of copolymerizing with the soluble aromatic copolymer (A); a photopolymerization initiator (C); and a polymer binder (D), wherein the soluble aromatic copolymer (A) accounts for 5 to 60 wt % of the composition.

The soluble aromatic copolymer (A) is advantageously a copolymer obtained by cationic polymerization of 20 to 90 wt % of a divinyl aromatic compound and 80 to 10 wt % of an aromatic monoolefinic compound containing a monovinyl aromatic compound as an essential component in the presence of a hydroxy compound or a precursor thereof capable of providing a hydroxyl group at the end of the copolymer as a polymerization initiator and a Lewis acid. The aromatic monoolefinic compound is preferably the monovinyl aromatic compound itself or a mixture of the monovinyl aromatic compound and an aromatic olefin selected from indene, acenaphthylene, benzothiophene, and derivatives thereof. Further, the soluble aromatic copolymer (A) advantageously comprises 10 to 90 mol % of a structural unit represented by the following formula (a2)

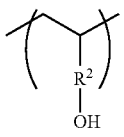

(a2)

where $R^2$ is an aromatic hydrocarbon group of 6 to 30 carbon atoms.

Further, this invention relates to an optical information recording medium for volume phase hologram recording wherein a recording layer constituted of the aforementioned photosensitive resin composition for volume phase hologram recording is formed on a substrate or between two substrates. Further, this invention relates to a volume phase hologram obtained by recording an interference pattern on the aforementioned optical information recording medium by an energy ray of highly coherent nature. Still further, this invention relates to a method for producing a volume phase hologram comprising exposing an interference pattern by an energy ray of highly coherent nature on the aforementioned optical information recording medium.

This invention will be described further below.

The photosensitive resin composition for volume phase hologram recording of this invention is used for recording an interference pattern formed by the interference of light of highly coherent nature in bands differing from one another in refractive index and it comprises a soluble aromatic copolymer (A), a photoradically polymerizable compound (B), a photopolymerization initiator (C), and a polymer binder (D) as essential components.

First, the soluble aromatic copolymer (A) will be described.

The soluble aromatic copolymer (A) is obtained by copolymerizing a divinyl aromatic compound with an aromatic monoolefinic compound containing a monovinyl aromatic compound as an essential component and comprises a hydroxyl group and 10 to 90 mol %, preferably 20 to 50 mol %, of the aforementioned structural unit having a reactive vinyl group in the side chain represented by the aforementioned formula (a1). The structural unit represented by formula (a1) is derived from the divinyl aromatic compound used as a monomer. Advantageously, one copolymer molecule contains 3 or more of the structural units represented by formula (a1) on average. The ratio of the divinyl aromatic compound to the monovinyl aromatic compound is 10 to 90 wt % of the divinyl aromatic compound to 90 to 10 wt % of the aromatic monoolefinic compound and, as needed, 30 wt % or less of another olefinic compound may be used. Here, the aromatic monoolefinic compound contains 50 wt % or more, preferably 70 wt % or more, of the monovinyl aromatic compound as an essential component. It is to be noted that the structural unit refers to a unit in the polymer formed from one monomer.

As the soluble aromatic copolymer (A) is obtained by copolymerizing materials containing a divinyl aromatic compound, one portion of the divinyl aromatic compound yields a structural unit represented by formula (a1) while another portion yields units containing crosslinked and other structures. However, excessive formation of the crosslinked structure leads to the production of a solvent-insoluble copolymer and, as will be described later, the polymerization conditions are so controlled as to produce a soluble copolymer.

Examples of the divinyl aromatic compound include, but are not limited to, m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributylnaphthalene, and 2,2'-divinyl-4-ethyl-4'-propylbiphenyl. These compounds may be used singly or as a combination of two kinds or more.

Preferable examples of the monovinyl aromatic compound include divinylbenzenes (of m- and p-isomers), divinylbiphenyls (of various isomers), and divinylnaphthalenes (of various isomers) in consideration of cost and heat resistance of the polymer resulting therefrom; divinylbenzenes and divinylbiphenyls are more preferable and divinylbenzenes are most preferable.

The aromatic monoolefinic compound containing a monovinyl aromatic compound as an essential component is available as a monovinyl aromatic compound alone or as a mixture of a monovinyl aromatic compound and another aromatic olefin. Examples of the monovinyl aromatic compound include styrene, vinylnaphthalene, vinylbiphenyl, and derivatives thereof, the derivatives include aromatic vinyl compounds whose ring carbon is substituted with a group such as alkyl, alkoxy, halogen, phenyl, hydroxyl, and the like and aromatic vinyl compounds whose vinyl group is substituted with any one of the foregoing substituent groups at the α- or β-position. Examples of another aromatic olefin include indene, acenaphthylene, benzothiophene, and derivatives thereof.

Examples of the derivatives of styrene include methylstyrene, ethylstyrene, propylstyrene, butylstyrene, pentylstyrene, hexylstyrene, cyclohexylstyrene, ethoxystyrene, propoxystyrene, butoxystyrene, pentoxystyrene, hexoxystyrene, cyclohexoxystyrene, phenoxystyrene, and hydroxystyrene. The substituent may be located at the o-, m-, or p-position to the vinyl group; when the substituent can have a side chain, the side chain may be a linear or branched alkyl or alkoxy group.

Examples of the derivatives of indene include indene, indene substituted with an alkyl group of 1 to 6 carbon atoms, indene substituted with an alkoxy group of 1 to 6 carbon atoms, and sulfur-containing benzothiophene. Examples of the derivatives of acenaphthylene include acenaphthylene, acenaphthylene substituted with an alkyl group of 1 to 6 carbon atoms, acenaphthylene substituted with a phenyl group, and acenaphthylene substituted with a halogen such as chlorine and bromine.

The aromatic monoolefinic compounds are not limited to the aforementioned examples. Of these aromatic monoolefinic compounds, aromatic vinyl compounds whose ring carbon is substituted with an alkyl group and aromatic vinyl compounds whose vinyl group is substituted with an alkyl group at the α-position are preferable as they form a large amount of an indane structure in the skeleton of the copolymer during polymerization. Preferable examples from the viewpoint of cost and heat resistance of the polymer resulting therefrom include ethylvinylbenzenes (of m- and p-isomers), ethylvinylbiphenyls (of various isomers), and ethylvinylnaphthalenes (of various isomers).

The soluble aromatic copolymer (A) is obtained by copolymerizing the divinyl aromatic compound with the aromatic monoolefinic compound containing the monovinyl aromatic compound as described above and, as needed, other cationically polymerizable monomers may be used. The monomers of this kind include trivinyl aromatic compounds, diene compounds such as butadiene and isoprene, alkyl vinyl ethers, isobutene, diisobutylene, and sulfur-containing vinyl compounds. These other monomers are used within the range that is less than 30 mol % of the total monomers. The divinyl aromatic compound is used in an amount corresponding to 20 to 90 mol %, preferably 40 to 80 mol %, of the total monomers while the aromatic monoolefinic compound is used in an amount corresponding to 10 to 80 mol %, preferably 20 to 60 mol %, of the total monomers.

The soluble aromatic copolymer (A) has a hydroxyl group in the side chain or at the end of said copolymer apart from the structural unit represented by formula (a1). This hydroxyl group can be either alcoholic or phenolic. Moreover, the hydroxyl equivalent of the soluble aromatic copolymer (A) is preferably 100 to 30,000 g/equiv, more preferably 1,000 to 10,000 g/equiv. The desirable structural unit having a hydroxyl group is the one represented by formula (a1). In the case where the structural unit represented by formula (a1) is located at the end, one end of the unit is capped with a hydrogen atom or a nonpolymerizable group.

A method for introducing a hydroxyl group to a side chain of the soluble aromatic copolymer (A) comprises effecting copolymerization by using a hydroxyl-containing divinyl aromatic compound, a hydroxyl-containing aromatic monoolefinic compound, or another hydroxyl-containing monomer as a part of the monomers. Examples of such hydroxyl-containing monomers include hydroxydivinylbenzene and hydroxystyrene. A phenolic hydroxyl group is introduced by using an aromatic vinyl monomer whose ring carbon is substituted with a hydroxyl group while an alcoholic hydroxyl group is introduced by using an aromatic vinyl monomer whose vinyl group or side chain is substituted with a hydroxyl group. However, the method to be described next is used advantageously.

A method generally used for the introduction of a terminal hydroxyl group to the soluble aromatic copolymer (A) is cationic polymerization in the presence of a polymerization initiator system consisting of an alcoholic compound and a Lewis acid. Alternatively, a polymer is first prepared by using a polymerization initiator other than an alcoholic compound and then the polymer is treated for conversion of the functional group, for example, by the Friedel-Crafts reaction.

An alcoholic hydroxyl group is introduced to a side chain of the soluble aromatic copolymer (A) according to one of the following three methods: firstly, a monomer having an alcoholic hydroxyl group in the side chain is submitted to copolymerization in the presence of a polymerization initiator system consisting of an alcoholic compound and a Lewis acid; secondly, a monomer whose hydroxyl group is protected is submitted to copolymerization and thereafter the protective group is removed; thirdly, the copolymer (A) is prepared first and the functional group is then converted. This alcoholic hydroxyl group may be located in the side chain and/or at the end of the soluble aromatic copolymer (A), preferably only at the end in consideration of ease of introduction.

The polymerization for the production of the soluble aromatic copolymer (A) having an alcoholic hydroxyl group at the end or in the side chain is performed according to method (1) which effects direct introduction of the hydroxyl group by using a hydroxyl-containing monomer or initiator or method (2) which utilizes conversion of the functional group for indirect introduction of the hydroxyl group. According to either method, the target copolymer is synthesized basically by cationic polymerization generally using a Lewis acid catalyst. It is preferable to effect aqueous cationic polymerization in the presence of R—OH/$BF_3$.$OEt_2$ according to method (1) or to effect nonaqueous cationic polymerization in the presence of R—Cl/$SnCl_4$ and then convert the functional group of the resulting copolymer according to method (2). For example, a method described in patent document 8 or non-patent document 1 is desirable. This method is applied as follows.

The monomer components containing 20 to 100 mol % of a divinyl aromatic compound (a) are subjected to cationic polymerization in an organic solvent at a temperature of −30 to 50° C. using a Lewis acid catalyst and an initiator represented by the following general formula (1):

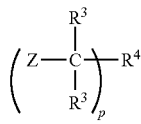

where $R^3$ is a hydrogen atom or a monovalent saturated hydrocarbon group of 1 to 6 carbon atoms, $R^4$ is a p-valent aromatic or aliphatic hydrocarbon group, Z is a halogen atom, a hydroxyl group, an alkoxy group of 1 to 6 carbon atoms, or an acyloxy group of 1 to 6 carbon atoms, and p is an integer of 1 to 6; when a plurality of $R^3$s and Zs are present in the molecule, they may be identical to or different from one another.

The organic solvent is preferably one kind or more of aromatic solvents having a dielectric constant of 2 to 40 and a donor component selected from the group of water, quaternary ammonium hydroxides, ether compounds of 3 or more carbon atoms, thioether compounds of 3 or more carbon atoms, and sulfoxide compounds of 2 or more carbon atoms is preferably incorporated in the organic solvent. Any organic solvent that does not substantially interfere with cationic polymerization can be used without particular limitation and a single solvent or a combination of two kinds or more of solvents may be used while controlling the dielectric constant within the range of 2 to 40.

The organic solvents include the following: halogenated hydrocarbons such as chloromethane, dichloromethane, n-propyl chloride, n-butyl chloride, trichloromethane, tetrachloromethane, chloroethane, dichloroethane, trichloroethane, tetrachloroethane, chloroethylene, dichloroethylene, chlorobenzene, dichlorobenzene, and trichlorobenzene; aromatic hydrocarbons such as benzene, toluene, xylene, ethylbenzene, propylbenzene, and butylbenzene; linear aliphatic hydrocarbons such as ethane, propane, butane, pentane, hexane, heptane, octane, nonane, and decane; branched aliphatic hydrocarbons such as 2-methylpropane, 2-methylbutane, 2,3,3-trimethylpentane, and 2,2,5-trimethylhexane; alicyclic hydrocarbons such as cyclohexane, methylcyclohexane, and ethylcyclohexane; and paraffin oil obtained by hydrorefining of a petroleum fraction. Of the solvents listed above, dichloromethane, acetonitrile, ethyl acetate, toluene, xylene, pentane, hexane, heptane, octane, 2-methylpropane, 2-methylbutane, methylcyclohexane, and ethylcyclohexane are preferred. From the viewpoint of a balance of polymerizability and solubility and ease of availability, dichloromethane, acetonitrile, ethyl acetate, toluene, xylene, n-hexane, cyclohexane, heptane, methylcyclohexane, and ethylcyclohexane are more preferred.

The amount of the organic solvent to be used is usually determined so that the concentration of the polymer becomes normally 1 to 50 wt %, preferably 5 to 35 wt %, in consideration of the viscosity of the polymer solution to be produced and ease of heat removal. The polymerization activity decreases when the dielectric constant is less than 2 while gelation tends to occur easily during polymerization when the dielectric constant exceeds 40. It is further preferable to carry out the polymerization using 0.001 to 100 moles, preferably 0.3 to 50 moles, of a Lewis acid catalyst and 0.001 to 10 moles of a donor component per 1 mole of a hydroxyl-containing initiator represented by general formula (1) in an organic solvent capable of dissolving a soluble organic copolymer.

Although the hydroxyl equivalent of the hydroxyl-containing initiator represented by general formula (1) is not specified, it is preferably 50 to 500 g/equiv in consideration of the reactivity.

Examples of the Lewis acid catalyst useful as a polymerization catalyst include metal halides such as boron(III) bromide, boron(III) chloride, aluminum(III) bromide, aluminum(III) fluoride, aluminum(III) chloride, aluminum(III) iodide, gallium(III) bromide, gallium(III) chloride, indium(III) bromide, indium(III) chloride, indium(III) fluoride, indium(III) iodide, thalium(III) bromide, thalium(III) fluoride, silicon(IV) bromide, silicon(IV) chloride, silicon(IV) fluoride, silicon(IV) iodide, germanium(IV) bromide, germanium(IV) chloride, germanium(IV) iodide, tin(IV) bromide, tin(IV) chloride, tin(IV) fluoride, tin(IV) iodide, lead(IV) fluoride, antimony(III) bromide, antimony(III) chloride, antimony(V) chloride, antimony(III) fluoride, antimony(V) fluoride, antimony(III) iodide, bismuth(III) bromide, bismuth(III) chloride, bismuth(III) fluoride, bismuth(III) iodide, titanium(IV) chloride, titanium(IV) bromide, $BF_3.OEt_2$, tungsten(VI) chloride, vanadium(V) chloride, iron(III) chloride, and zinc(II) bromide and organic metal halides such as $Et_2AlCl$ and $EtAlCl_2$. The catalysts are not specifically limited to the aforementioned examples and they can be used singly or as a combination of two kinds or more. Of the aforementioned catalysts, $BF_3.OEt_2$ is used preferably in the method for direct introduction of an alcoholic hydroxyl group while boron(III) bromide, boron(III) chloride, tin(IV) chloride, tin(IV) bromide, tin(IV) fluoride, tin(IV) iodide, or antimony(V) chloride is used in the method for indirect introduction of a hydroxyl group. From the viewpoint of control of the branched structure and polymerization activity, $BF_3.OEt_2$, boron(III) chloride, and tin(IV) chloride are preferred and tin(IV) chloride and $BF_3.OEt_2$ are particularly preferred. They can be used singly or as a combination of two kinds or more.

Of the initiators represented by general formula (1), those useful for direct introduction of an alcoholic hydroxyl group include alcohols such as benzyl alcohol, 1-phenylethyl alcohol, 2-phenyl-2-propanol (that is, α-cumyl alcohol), and 4-methoxy-α-methylbenzyl alcohol. On the other hand, the initiators useful for indirect introduction of an alcoholic hydroxyl group include (1-chloro-1-methylethyl)benzene, 1,4-bis(1-chloro-1-methylethyl)benzene, 1,3-bis(1-chloro-1-methylethyl)benzene, 1,3,5-tris(1-chloro-1-methylethyl)benzene, and 1,3-bis(1-chloro-1-methylethyl)-5-(tert-butyl)benzene; bis(1-chloro-1-methylethyl)benzene, 1-chloroethylbenzene, α-cumyl alcohol, and 4-methoxy-α-methylbenzyl alcohol are preferred.

The cationic polymerization for the production of the soluble aromatic copolymer (A) is carried out in the presence of a Lewis acid at a temperature in the range of −30 to 50° C. When the polymerization is carried out below −30° C., the heat resistance of the product copolymer deteriorates, which is not desirable. On the other hand, when the polymerization temperature exceeds 50° C., the reaction rate becomes too high to allow proper control of the reaction and an insoluble gel tends to form as a result of crosslinking, which is also undesirable. The method for recovering the copolymer after termination of the polymerization reaction is not specifically limited and a method in common use such as steam stripping and precipitation by a poor solvent is used satisfactorily.

The soluble aromatic copolymer (A) preferably comprises 0 to 20 mol % of an indane structural unit represented by the following general formula (2)

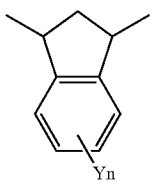

(2)

(where Y is a saturated or unsaturated aliphatic or aromatic hydrocarbon group or an unsubstituted or substituted aromatic ring condensed to the benzene ring and n is an integer of 0 to 4) in its backbone skeleton. The indane structure is formed as the active point generated at the end of a growing polymer attacks an aromatic ring in the structural unit derived from the divinyl aromatic compound and the monovinyl aromatic compound when the soluble aromatic copolymer (A) is produced according to the aforementioned method under the specific conditions in respect to the solvent, catalyst, temperature, and the like. The indane structural unit exists preferably at a rate of 0.01 mol % or more, more preferably 0.1 mol % or more, most preferably 1 mol % or more, in relation to the structural units of all the monomers. The particularly preferred rate is 1 to 3 mol %. The absence of the aforementioned indane structure in the backbone skeleton of the polyfunctional vinyl aromatic copolymer leads to insufficient heat resistance and solvent solubility, which is undesirable.

The number average molecular weight of the soluble aromatic copolymer (A) (determined by gel permeation chromatography against polystyrene standard and hereinafter referred to as $M_n$) is preferably 400 to 30,000, more preferably 500 to 10,000. When the $M_n$ is less than 400, the copolymer (A) shows an extremely low viscosity and poor processability, which is undesirable. On the other hand, when the $M_n$ is 30,000 or more, rapid mass transfer is inhibited when a hologram is recorded, which is also undesirable. Furthermore, the molecular weight distribution ($M_w/M_n$) is preferably 10 or less. When the $M_w/M_n$ exceeds 10, problems arise undesirably in that the soluble polyfunctional aromatic copolymer becomes difficult to process and gels tend to form.

The soluble aromatic copolymer (A) has a hydroxyl group. The hydroxyl group may originate from hydroxystyrene or hydroxydivinylbenzene used as a part of the raw material monomers or it may be introduced at the end of the molecule by the use of an initiator having a hydroxyl group or a functional group capable of yielding a hydroxyl group as the aforementioned reaction initiator. The latter procedure is preferred. The hydroxyl group may be linked directly to the aromatic ring, to the side chain of the aromatic ring, or to the vinyl group of the monomer. The quantity of the hydroxyl group expressed in terms of the hydroxyl equivalent is preferably in the range of 400 to 30,000 g/equiv and keeping the hydroxyl equivalent in this range improves the compatibility or storage stability of the composition.

The soluble aromatic copolymer (A) is capable of undergoing polymerization as it has a structural unit containing an unsaturated bond represented by formula (a1); however, a portion of the vinyl groups in the divinyl aromatic compound does not participate in the polymerization during the production of the soluble aromatic copolymer and the copolymer is soluble in a solvent. Concretely, the copolymer is soluble in one of toluene, xylene, tetrahydrofuran, dichloromethane, and chloroform, preferably, in any of these solvents. Thus, the soluble aromatic copolymer can move to eliminate a concentration gradient when a specific part of the composition is polymerized.

The photoradically polymerizable compound (B) will be described next.

The photoradically polymerizable compound (B) to be used in this invention is any compound which is compatible with the soluble aromatic copolymer (A) and the polymer binder (D) or the plasticizer (E) to be described later and polymerizes by an active radical species generated from a photopolymerization initiator (radical polymerization initiator). A monomer containing at least one polymerizable functional group such as a (meth)acryloyl group, a vinyl group, and an allyl group in the molecule is used advantageously. The photoradically polymerizable compound (B) may be a mixture of two kinds or more of photoradically polymerizable compounds differing in polymerizability and refractive index from each other. It is to be noted that the soluble aromatic copolymer (A) is not treated as the photoradically polymerizable compound (B).

The components that polymerize first upon photoirradiation (in the bright portion of interference light) are mainly the photoradically polymerizable compound (B) and the soluble aromatic copolymer (A). The copolymer (A) was submitted to fluorescent labeling with fluorescein and the observation of its behavior before and after hologram recording under a fluorescence microscope gave the following results: first, the copolymer (A) was concentrated in the bright portion of interference light; second, in a system in which an aromatic oligomer having no reactive vinyl group was used in place of the soluble aromatic copolymer (A), recording was possible for an instant, but the record gradually faded out when it was left standing. These results imply that the soluble aromatic copolymer (A) plays a role of fixing the record by reacting with the photoradically polymerizable compound (B). Therefore, it is conceivable that the cured material derived from the soluble aromatic copolymer (A) and the photoradically polymerizable compound (B) is concentrated in the bright portion (cured material concentration phase) while the polymer binder (D) or the polymer binder (D) and the plasticizer (E) are concentrated in the dark portion (non-cured material concentration phase), thereby producing a difference in refractive index between the two phases. Hence, it is necessary that the cured material concentration phase differs in refractive index from the non-cured material concentration phase by a prescribed quantity. The refractive index can be adjusted by properly selecting the kind and quantity of the photoradically polymerizable compound (B) and the polymer binder (D) or the plasticizer (E).

Examples of the photoradically polymerizable compound (B) include the following compounds: monofunctional (meth)acrylates such as methyl (meth)acrylate, butyl (meth) acrylate, 2-ethylhexyl (meth)acrylate, lauryl (meth)acrylate, ethyl carbitol (meth)acrylate, phenoxyethyl (meth)acrylate, nonylphenoxyethyl (meth)acrylate, dicyclopentenyl (meth) acrylate, isobornyl (meth)acrylate, tribromobenzyl (meth) acrylate, and acryloylmorpholine; silicon-containing (meth) acrylates such as (meth)acryloyloxypropyltris(methoxy) silane; di(meth)acrylates of the alkylene oxide adducts of bisphenols such as bisphenol F, bisphenol A, and hydrogenated bisphenol A; polyfunctional (meth)acrylates such as trimethylolpropane tri(meth)acrylate, dipentaerythritol pentaacrylate, pentaerythritol triacrylate, pentaerythritol tetraacrylate, ditrimethylol tetraacrylate, and dipentaerythritol hexaacrylate; epoxy (meth)acrylates resulting from the reaction of a variety of known epoxy compounds with (meth) acrylic acid such as ethylene glycol diglycidyl ether epoxy (meth)acrylate, propylene glycol diglycidyl ether epoxy di(meth)acrylate, phenol glycidyl ether epoxy (meth)acrylate, resorcin diglycidyl ether epoxy (meth)acrylate, bisphenol A diglycidyl ether epoxy di(meth)acrylate, bis(4-hydroxyphenyl) sulfide diglycidyl ether epoxy (meth)acrylate, phenol novolak epoxy (meth)acrylate, cresol novolak epoxy (meth)acrylate, bisphenol (for example, bisphenol A and bisphenol F) epoxy resin (meth)acrylate, biphenyl (for example, 3,3',5,5'-tetramethylbiphenol) epoxy (meth)acrylate, and tris(2,3-epoxypropyl) isocyanurate (meth)acrylate; acrylamide derivatives such as N,N-dimethylacrylamide and N,N-diethylacrylamide; monofunctional vinyl compounds such as vinylbenzene, divinylbenzene, vinylnaphthalene, vinylbiphenyl, acenaphthylene, styrene, p-chlorostyrene, N-vinylcarbazole, N-vinylpyrrolidone, and N-vinylcaprolactam; allyl group-containing compounds such as diallylidenepentaerythritol, diallyl phthalate, diallyl isophthalate, ethylene glycol di(allyl carbonate), triallyl trimellitate, and triallyl (iso)cyanurate; a variety of known polymerizable monomers and oligomers such as urethane (meth)acrylates, polyurethane (meth)acrylates, thiourethane acrylates, polythiourethane acrylates, ester acrylates, polyester (meth)acrylates, polyether (meth)acrylates, sulfur-containing (meth)acrylates, sulfur-containing polyfunctional (meth)acrylates, fluorine-containing (meth)acrylates, and silicon-containing (meth)acrylates; and a variety of photopolymerizable oligomers. Of the compounds mentioned above, (meth)acrylate monomers of good photocurability are preferred. In particular, a combination of (meth)acrylates containing at least bifunctional or higher (meth)acrylates shows excellent hologram-recording property.

The photoradically polymerizable compound (B) is incorporated in a composition and cured by photoirradiation, but it undergoes curing partly as a result of its copolymerization with the soluble aromatic copolymer (A). In the course of this radical copolymerization, a hydroxyl group is introduced also to the copolymer formed from the photoradically polymerizable compound (B) and the soluble aromatic copolymer (A). The introduction of the hydroxyl group changes the compatibility of the copolymer with the co-existing polymer binder (D) and improves the hologram-recording characteristics.

The photopolymerization initiator (C) will be described next.

The photopolymerization initiator (C) may be any initiator that absorbs a visible light laser beam such as He—Ne laser (633 nm), Ar laser (515, 488 nm), green YAG laser (532 nm), He—Cd laser (442 nm), and blue DPSS laser (405 nm) to generate an active radical species capable of initiating the polymerization of the essential components of this invention, which are the soluble aromatic copolymer (A) and the photoradically polymerizable compound (B). Further, a pigment sensitizer may be added to raise the sensitivity at respective laser light wavelength.

Examples of the photopolymerization initiator include 2,2-diethoxyacetophenone, 2,2-diethoxy-2-phenylacetophenone, benzophenone, 1-(4-isopropylphenyl)-2-hydroxy-2-methylpropan-1-one, 2-hydroxy-2-methyl-1-phenylpropan-1-one, benzoin ethyl ether, benzoin isobutyl ether, benzoin isopropyl ether, 1-hydroxycyclohexyl phenyl ketone, 2,2-dimethoxy-1,2-diphenylethan-1-one, 2-hydroxy-2-methyl-1-phenylpropan-1-one, 1-(4-hydroxyethoxy)phenyl-2-hydroxy-2-methylpropan-1-one, 2-methyl-1-[4-(methylthio)phenyl]-2-morpholinopropan-1-one, 2-benzyl-2-dimethylamino-1-(4-morpholinophenyl)butan-1-one, bis(2,4,6-trimethylbenzoyl)phenylphosphine oxide, bis(2,6-dimethoxybenzoyl)-2,4,4-trimethylpentylphosphine oxide, 2,4,6-trimethylbenzoyl-diphenylphosphine oxide, bis(η5-2,4-cyclopentadien-1-yl)-bis[2,6-difluoro-3-(1H-pyrr-1-yl)phenyl]titanium, 4,4-bis(dimethylamino)benzophenone, methyl benzoisoformate, benzyl dimethyl ketal, benzoylbenzoic acid, ethyl 4-dimethylaminobenzoate, 2-chlorothioxanthone, 2-methylthioxanthone, 2,4-diethylthioxanthone, 2,4-dimethylthioxanthone, camphorquinone, benzil, and 4,4'-diethylaminobenzophenone. Examples of commercially available photopolymerization initiators include Irgacure 184, 369, 500, 651, 819, 907, 784, and 2959 and Darocur 1116 and 1173 (all manufactured by Ciba Specialty Chemicals Inc.).

The aforementioned photopolymerization initiators may be used together with thermopolymerization initiators. Examples of such thermopolymerization initiators include 2,2'-azobis(2-methylbutyronitrile), 2,2'-azobisisobutyronitrile, 2,2'-azobisisovaleronitrile, 2,2'-azobis(2,4-dimethylvaleronitrile), 1,1'-azobis(cyclohexane-1-carbonitrile), methyl ethyl ketone peroxide, methyl isobutyl ketone peroxide, benzoyl peroxide, and 2,4-dichlorobenzoyl peroxide.

The amount of initiator to be added varies with the kind of initiator, kind of compound to be mixed with the initiator, and ratio of components in the composition and cannot be determined routinely. However, it is preferably in the range of 0.05 to 30 wt %, most preferably in the range of 0.1 to 8 wt %, in relation to the total amount of the photosensitive resin composition. Addition of less than 0.05 wt % gives a composition that cures poorly while leaving some reactants unchanged and shows inferior recording stability. On the other hand, addition in excess of 30 wt % gives a composition that polymerizes with a low degree of polymerization, yields an extremely soft cured material, and occasionally suffers some loss in transparency. Thus, addition outside the specified range produces undesirable results. Addition of 0.1 to 8 wt % gives a photosensitive resin composition that cures exceptionally well and shows excellent hologram characteristics.

When a pigment sensitizer is used, any pigment sensitizer that is capable of absorbing visible light is acceptable and examples include known compounds such as (thio)xanthene pigments, cyanine pigments, melocyanine pigments, squalirium pigments, thiopyrylium salt pigments, quinoline pigments, base styryl pigments, (keto)coumarin pigments, rhodacyanine pigments, porphyrin pigments, and oxazine pigments. These compounds may be used singly or as a combination of two or more.

In this invention, the polymer binder (D) may be used, for example, for the purpose of improving film-forming property and film strength to cope with an increase in film thickness or increasing environment resistance after recording of a hologram. The polymer binder (D) suitable for this purpose is preferably a material that is highly transparent and compatible with the soluble aromatic copolymer (A). Examples include polystyrene and derivatives thereof, methyl methacrylate-styrene copolymer (MS resin), styrene-acrylonitrile copolymer (AS or SAN resin), poly(4-methylpentene-1) (TPX resin), polycycloolefin (COP resin), polydiethylene glycol bisallyl carbonate (EGAC resin), polythiourethane (PTU resin), poly(methyl vinyl ether) (PMVE resin), polysulfone resin, polyvinyl acetate, polyvinyl alcohol, polyvinylpyrrolidone, and acetylcellulose. The polymer binder (D) may have a reactive group such as a cationically polymerizable group in its side chain or backbone. One or more of these compounds may be added.

In this invention, the plasticizer (E) may be used as a compound that improves the mass transfer of the soluble aromatic copolymer (A) and the photoradically polymerizable compound (B) and the compatibility of the photosensitive resin composition. The plasticizer (E) can be selected preferably from liquid compounds that are highly compatible with the soluble aromatic copolymer (A) and the photoradically copolymerizable compound (B) and additionally capable of facilitating the mass transfer at the time of recording. Examples of the plasticizer (E) include the following known plasticizers: sebacate esters such as dimethyl sebacate, diethyl sebacate, dibutyl sebacate, and bis(2-ethylhexyl) sebacate; adipate esters such as dimethyl adipate, diethyl adipate, dibutyl adipate, and bis(2-ethylhexyl) adipate; phthalate esters such as dimethyl phthalate, diethyl phthalate, dibutyl phthalate, bis(2-ethylhexyl) phthalate, and diisodecyl phthalate; and orthophosphate esters such as trimethyl phosphate, triethyl phosphate, tributyl phosphate, (2-ethylhexyl) phosphate, triphenyl phosphate, cresyl diphenyl phosphate, and tricresyl phosphate. These plasticizers can be used singly or as a mixture.

Moreover, it is allowable to add a thermal polymerization inhibitor, a chain transfer agent, an antioxidant, a silane coupling agent, a painted surface conditioner, a surface conditioner, a plasticizer, an antifoaming agent, a surfactant, a colorant, a storage stabilizer, an ultraviolet absorber, or a thickener as needed.

When the resin composition of this invention is solid or too viscous to be applicable as a coating, a solvent (G) may be used to dissolve or disperse the resin composition. Examples of the solvent (G) include the following: ketones such as acetone, methyl ethyl ketone, methyl isobutyl ketone, and cyclohexanone; esters such as ethyl acetate and butyl acetate; petroleum-derived solvents such as toluene and xylene; Cellosolves such as Methyl Cellosolve, Ethyl Cellosolve, and Butyl Cellosolve; alcohols such as ethanol, methanol, isopropanol, and butanol; and halogenated hydrocarbons such as dichloromethane and chloroform. The solvent may be added preferably at a rate of 200 parts by weight or less, more preferably 100 parts by weight or less, per 100 parts by weight of solid resin. The solvent preferably has a boiling point of 100° C. or below in order to raise the efficiency of the subsequent drying process. It is to be noted that the solvent (G) is a component merely added to dissolve or disperse the resin composition and it is not counted in the calculation of the content of respective component in this invention.

Although the components (A) to (D) are essential in formulating the composition of this invention, it is preferable to use the plasticizer (E). Moreover, the components (A) to (G) are not limited to the examples cited in the description of respective components.

Composition of Hologram-recording Material:

The photosensitive resin composition for volume phase hologram recording of this invention is formulated from the following components at the following rates in relation to the total weight of the composition (exclusive of the solvent): the soluble aromatic copolymer (A) at a rate of 5 to 60 wt %, preferably 10 to 40 wt %; the photoradically polymerizable compound (B) at a rate of 5 to 50 wt %, preferably 10 to 40 wt %; the photopolymerization initiator (C) at a rate of 0.05 to 30 wt %, preferably 1 to 10 wt % (in the case where a pigment sensitizer is incorporated, the pigment sensitizer is added at a rate of 0.01 to 10 wt % and the sum of the photopolymerization initiator and the pigment sensitizer does not exceed 30 wt %); the polymer binder (D) at a rate of 1 to 50 wt %, preferably 10 to 40 wt %; the plasticizer (E) at a rate of 0 to 40 wt %, preferably 10 to 35 wt %; the sum of the polymer binder (D) and the plasticizer (E) at a rate of 20 to 80 wt %, preferably 30 to 70 wt %.

Preparation of Transmission Type Hologram Recording Medium:

When the support is made up of a single piece, a method suitable for the preparation of a transmission type hologram recording medium from the photosensitive resin composition of this invention comprises a step for applying the photosensitive resin composition prepared in the liquid form to a substrate such as a glass plate, a polycarbonate plate, a polymethyl methacrylate plate, and a polyester film to a thickness after drying of 1 to 1,000 μm using a known coating device such as a spin coater, a roll coater, and a bar coater and, as needed, a step for drying. A protective layer for oxygen shut-off may be formed on the layer of the photosensitive resin composition. This protective layer may be the same as the aforementioned substrate or it may be a film of polyolefin, polyvinyl chloride, polyvinylidene chloride, polyvinyl alcohol, or polyethylene terephthalate or a sheet of glass. The photosensitive liquid may be diluted with a suitable solvent, as needed, at the time of application. In this case, however, the diluted liquid must be dried after its application to the substrate.

When the support is made up of two pieces, the composition of this invention is injected into the transparent support. Concretely, there are several methods for this injection: according to a first method, a pair of transparent pieces constituting the substrate is arranged so that they become positioned on both sides of the completed recording layer and the composition is injected between the two pieces; according to a second method, the support in the shape of a transparent box is provided with an injection hole and the composition is injected into the box through the hole; according to a third method, a transparent box constituting one piece of the support is left open on one side, the composition is injected or added in drops to the box, and the open side is sealed by a transparent cover constituting the other piece of the substrate.

Light Source of Transmission Type Hologram Recording and Recording Method:

The recording layer prepared as described above can form a volume phase hologram by subjecting it to interference exposure by any of the conventional methods. For example, an ordinary exposure apparatus for holography using laser light or light of highly coherent nature (capable of displaying stable interference effects), for example, light having a wavelength of 300 to 1,200 nm, records an interference pattern in the inside of the recording layer by two-beam interference pattern exposure. At this stage, the light is diffracted by the recorded interference pattern, thereby providing a hologram. A light source suitable for the hologram recording material of this invention is a He—Ne laser (633 nm), an Ar laser (515, 488 nm), a YAG laser (532 nm), a He—Cd laser (442 nm), or a blue DPSS laser (405 nm). Furthermore, after the aforementioned hologram recording with a laser, the film of the photorecording composition is either irradiated with ultraviolet (UV) rays over the whole surface using a xenon lamp, a mercury lamp, or a metal halide lamp or heated at 60° C. or thereabouts to accelerate the polymerization of some of the radically polymerizable compound remaining unchanged and the phase separation accompanying the mass transfer. In this manner, a hologram exhibiting excellent characteristics is obtained.

PREFERRED EMBODIMENTS OF THE INVENTION

This invention will be described concretely below with reference to the examples, but it is not limited to these examples. The following symbols are used for monomers and polymers in the examples.

DVB: divinylbenzene monomer
DVB570: a mixture of DVB and ethylvinylbenzene at a ratio of 57:43 (manufactured by Nippon Steel Chemical Co., Ltd.)

MPSMA: bis(4-methacryloylthiophenyl) sulfide (manufactured by Sumitomo Seika Chemicals Co., Ltd.)
S2EG: bis(2-methacryloythioethyl) sulfide (manufactured by Sumitomo Seika Chemicals Co., Ltd.)
SiMA: methacrylate-modified silicone oil (manufactured by Toray Dow Co., Ltd.)
MS-200: methyl methacrylate-styrene (20:80) copolymer
MS-400: methyl methacrylate-styrene (40:60) copolymer The holograms and the photosensitive resin compositions in the examples were evaluated according to the following methods.

Evaluation of Hologram:

Evaluation of Diffraction Efficiency

The diffraction efficiency of a transmission type hologram was calculated by the following equation using the value read out with an optical power meter from the light diffracted by a linear-polarized type He—Ne laser (633 nm).

Diffraction efficiency (%)=[(intensity of diffracted light)/(intensity of incident light)]×100

Evaluation of Storage Stability (Shelf Life)

The storage stability was evaluated by measuring the difference in the maximum diffraction efficiency and transparency between immediately after the preparation of the sample and one month after the storage of the sample at 60° C. and the results were expressed as follows: ○, within 5%; Δ, 5 to 20%; X, 20% or more.

Volume Shrinkage of Photosensitive Resin Composition

The cure shrinkage of the photosensitive resin composition can be calculated from the densities before and after curing by the following equation.

Cure shrinkage (%)=[1−(density of liquid)]/(density of film)]×100

Here, the curing was effected by irradiating a 50 μm-thick sample in the air with UV rays at 6 mW/cm² using a spot UV irradiation device as a light source.

Method for Measuring Hydroxyl Equivalent

The hydroxyl equivalent of the synthesized resin can be regarded as the molecular weight of one hydroxyl group in the resin. The hydroxyl equivalent of the soluble aromatic copolymer (A) is the value measured by a method involving acetylation with acetyl chloride and titration with potassium hydroxide. Concretely, the hydroxyl group of the polymer is acetylated in pyridine, the excess reagent is decomposed by water, and the acetic acid thereby generated is titrated with a methanol solution of potassium hydroxide. However, when the number of hydroxyl groups in the polymer is extremely small (that is, when the hydroxyl equivalent is exceptionally large) and its analysis cannot be performed precisely as it is outside the range of quantitative measurement by titration, the hydroxyl equivalent is calculated from the ratio of the peak of a hydroxyl proton to that of a suitable proton in the backbone determined by $^1$H-NMR analysis.

Structure of Polymer

The structure of a polymer was determined by $^{13}$C-NMR and $^1$H-NMR analyses with a nuclear magnetic resonance spectrometer, Model JNM-LA 600 manufactured by JEOL Ltd. Using chloroform-$d_1$ as a solvent and the resonance line of tetramethylsilane as an internal standard.

SYNTHETIC EXAMPLE 1

To a 5,000-ml flask were introduced 1.54 moles (227.8 ml) of divinylbenzene, 1.16 moles (166.2 ml) of ethylvinylbenzene, 136.1 ml of a dichloromethane solution of 450.3 millimoles of 1-phenylethyl alcohol (concentration, 3.31 millimoles/ml), and 2,192 ml of dichloromethane (dielectric constant, 9.1) and the mixture was cooled to 0° C. Then, 5.63 moles of pure water and 125.8 ml of a dichloromethane solution of 225.1 millimoles of boron trifluoride.diethyl ether complex ($BF_3.OEt_2$) (concentration, 1.79 millimoles/ml) were added and the reaction was carried out for 1 hour. The polymerization reaction was terminated by pure water that had been cooled in advance, the reaction mixture was separated by pure water in a separatory funnel, and the unchanged initiator and the catalyst were removed. Thereafter, the organic layer was poured into a large quantity of methanol at room temperature to separate a hydroxyl group-containing soluble aromatic copolymer. The copolymer was washed with methanol, filtered, dried, and weighed to give 271.8 g of the hydroxyl group-containing soluble aromatic copolymer (A1). The yield was 76.8 wt %. The copolymer (A1) had an $M_w$ of 4,530, an $M_n$ of 3,100, an $M_w/M_n$ of 1.46, and a hydroxyl equivalent of 1,920 g/equiv. The copolymer (A1) contained 28 mol % of the vinyl group represented by formula (a1) and 1.1 mol % of the indane structure represented by formula (2).

SYNTHETIC EXAMPLE 2

To a 5,000-ml flask were introduced 1.59 moles (235.2 ml) of divinylbenzene, 0.93 mole (133.3 ml) of ethylvinylbenzene, 0.28 mole (37.3 ml) of p-hydroxystyrene, 192.1 ml of an acetonitrile solution of 466.7 millimoles of α-cumyl alcohol (concentration, 2.43 moles/ml), and 2,388 ml of acetonitrile (dielectric constant, 37.5) and the mixture was cooled to −15° C. Then, 2.40 moles of pure water and 53.7 ml of an acetonitrile solution of 96.1 millimoles of boron trifluoride.diethyl ether complex ($BF_3.OEt_2$) (concentration, 1.79 millimoles/ml) were added and the reaction was carried out for 3 hours. The polymerization reaction was terminated by pure water that had been cooled in advance and the reaction mixture was separated by pure water in a separatory funnel to remove the unchanged initiator and the catalyst. Thereafter, the organic layer was poured into a large quantity of methanol at room temperature to separate a hydroxyl group-containing soluble aromatic copolymer. The copolymer was washed with methanol, filtered, dried, and weighed to give 318.9 g of the hydroxyl group-containing soluble aromatic copolymer (A2). The yield was 87.7 wt %. The copolymer (A2) had an $M_w$ of 19,660, an $M_n$ of 9,360, an $M_w/M_n$ of 2.10, and a hydroxyl equivalent of 4,140 g/equiv. The copolymer (A2) contained 26 mol % of the vinyl group represented by formula (a1) and 1.3 mol % of the indane structure represented by formula (2).

SYNTHETIC EXAMPLE 3

To a 3,000-ml flask were introduced 1.75 moles (258.9 ml) of divinylbenzene, 1.30 moles (186.3 ml) of ethylvinylbenzene, 224.1 ml of a toluene solution of 289.1 millimoles of 1-chloroethylbenzene (concentration, 1.29 millimoles/ml), and 2,282 ml of toluene (dielectric constant, 2.38) and the mixture was heated at 35° C. Then, 20.7 ml of a toluene solution of 12.14 millimoles of $SnCl_4$ (concentration, 0.584 millimole/ml) was added and the reaction was carried out for 4 hours. The polymerization reaction was terminated with a small amount of methanol that had been bubbled with nitrogen and the reaction mixture was poured into a large quantity of methanol at room temperature to separate a chlorine-containing soluble aromatic copolymer. The copolymer was washed with methanol, filtered, dried, and weighed to give 226.43 g of the chlorine-containing soluble aromatic copolymer (A3). The yield was 56.6 wt %. The polymerization activity was 3.47 (g polymer/millimole Sn·hr). The copolymer (A3) had an $M_w$ of 5,915, an $M_n$ of 1,890, and an $M_w/M_n$ of 3.13. The copolymer (A3) contained 30 mol % of the vinyl group represented by formula (a1) and 1.5 mol % of the indane structure represented by formula (2).

SYNTHETIC EXAMPLE 4

To a 5,000-ml flask were introduced 1.51 moles (223.4 ml) of divinylbenzene, 0.71 mole (123.2 ml) of ethylvinylbenzene, 498.9 ml of a dichloroethane solution of 364.2 millimoles of 1-chloroethylbenzene (concentration, 0.73 millimole/ml), and 3,500 ml of dichloroethane (dielectric constant, 10.3), then 68.1 ml of a dichloroethane solution of 50.11 millimoles of $SnCl_4$ (concentration, 0.736 mole/ml) was added at 70° C. and the reaction was carried out for 3 hours. The polymerization reaction was terminated with a small amount of methanol that had been bubbled with nitrogen and the reaction mixture was poured into a large quantity of methanol at room temperature to separate a chlorine-containing soluble aromatic copolymer. The copolymer was washed with methanol, filtered, dried, and weighed to give 178.91 g of the chlorine-containing soluble aromatic copolymer (A4). The yield was 61.3 wt %. The polymerization activity was 8.54 (g polymer/millimole Sn·hr). The copolymer (A4) had an $M_w$ of 49,700, an $M_n$ of 9,730, and an $M_w/M_n$ of 5.1. The copolymer (A4) contained 25 mol % of the vinyl group represented by formula (a1) and 1.2 mol % of the indane structure represented by formula (2).

EXAMPLES

Example 1

A solution of a photosensitive resin composition for volume phase hologram recording was prepared by dissolving the following components in 50 g of: toluene: copolymer (A1) obtained in Synthetic Example 1, 10 g; MS-200, 20 g; MPSMA, 15 g; bis[η(5)cyclopentadienyl]-bis-[2,6-difluoro-3-(pyrr-1-yl)phenyl]titanium (Irgacure 784 manufactured by Ciba Specialty Chemicals Inc.), 0.5 g; and tricresyl phosphate (TCP), 5 g.

The solution was applied to one side of a glass substrate (30×30×0.5 mm, coated on both sides with a reflection-preventing film) to a thickness after drying of 200 μm with a bar coater and dried for 2 hours in an inert oven that had been set at 65° C. and filled with nitrogen to yield a photosensitive plate for recording a volume phase hologram. This plate was covered with a glass plate to provide an optical information recording medium.

The two-beam interference exposure method with a green YAG laser (532 nm) was used for hologram recording and an interference pattern thereby formed and having a space frequency of approximately 1,000 strips/mm was entered from the PET side to the recording medium to record a volume phase hologram. The exposure of a transmission type hologram was performed by irradiating the photosensitive plate with light having an optical intensity of 1 mW./cm² for 10 to 100 seconds at a light exposure of 10 to 100 mJ/cm². The volume phase hologram thus obtained showed a diffraction efficiency of 67% at a light exposure of 16 mJ/cm². The cure shrinkage of the resin composition was 0.6%.

Examples 2-6 and Comparative Examples 1-3

Solutions of photosensitive resin compositions were prepared as in Example 1 according to the formulation shown in Table 1. Optical information recording media were obtained from these solutions, the holograms recorded thereon were evaluated, and the results are shown in Table 1. In Table 1, A1, A2, A3, and A4 indicate the copolymers obtained respectively in Synthetic Examples 1, 2, 3, and 4. The markings in Table 1 mean the following: ○, extremely good; Δ, good; X, inferior.

TABLE 1

| Component | Example | | | | | | | Comparative example | | | |
|---|---|---|---|---|---|---|---|---|---|---|---|
| | 1 | 2 | 3 | 4 | 5 | 6 | 7 | 1 | 2 | 3 | 4 |
| Formulation | | | | | | | | | | | |
| (A) Soluble aromatic copolymer(g) | | | | | | | | | | | |
| A1 | 10 | 10 | 10 | | | 10 | 10 | | | | |
| A2 | | | | 10 | 10 | | | | | | |
| A3 | | | | | | | | 10 | | 10 | |
| A4 | | | | | | | | | 10 | | |
| (B) Radically polymerizable monomer(g) | | | | | | | | | | | |
| MPSMA | 15 | 10 | | 15 | | 10 | | 15 | | | |
| S2EG | | 5 | | | | 5 | | | | | 15 |
| SiMA | | | 15 | | 15 | | 15 | | 15 | 15 | |
| DVB570 | | | | | | | | | | | 10 |
| (C) Photopolymerization initiator (g) | | | | | | | | | | | |
| Irgacure-784 | 0.5 | 0.5 | 0.5 | 0.5 | 0.5 | 0.5 | 0.5 | 0.5 | 0.5 | 0.5 | 0.5 |
| (D) Polymer binder (g) | | | | | | | | | | | |
| MS-200 | 20 | 20 | 20 | 20 | 20 | | | 20 | 20 | 20 | 20 |
| MS-400 | | | | | | 20 | 20 | | | | |
| (E) Plasticizer (g) | | | | | | | | | | | |
| TCP | 5 | 5 | 5 | 5 | 5 | 5 | 5 | 5 | 5 | 5 | 5 |
| (G) Solvent (g) | | | | | | | | | | | |
| Toluene | 50 | 50 | 50 | 50 | 50 | 50 | 50 | 50 | 50 | 50 | 50 |
| Property | | | | | | | | | | | |

TABLE 1-continued

| Component | Example 1 | Example 2 | Example 3 | Example 4 | Example 5 | Example 6 | Example 7 | Comparative example 1 | Comparative example 2 | Comparative example 3 | Comparative example 4 |
|---|---|---|---|---|---|---|---|---|---|---|---|
| Appearance | Transparent | Transparent | Transparent | Transparent | Transparent | Transparent | Transparent | Opaque | Opaque | Transparent | Transparent |
| Maximum diffraction efficiency (%) | 71 | 65 | 79 | 81 | 72 | 90 | 52 | Recording not possible | Recording not possible | 75 | 31 |
| Cure shrinkage (%) | 0.5 | 0.5 | 0.5 | 0.4 | 0.5 | 0.2 | 0.8 | — | — | 1 | 8.3 |
| Shelf life: change in transmission | Δ | ○ | ○ | ○ | ○ | ○ | ○ | — | — | x | x |
| Shelf life: change in diffraction efficiency | Δ | ○ | ○ | ○ | ○ | ○ | ○ | — | — | x | x |

*The photosensitive layer is 200 μm-thick in all cases
*The light exposure is 500 mJ/cm2 in all cases Industrial Applicability According to this invention, a photosensitive resin composition comprising a soluble polyfunctional vinyl aromatic copolymer having a hydroxyl group is used to provide a material for volume phase hologram recording characterized by high photosensitivity, low cure shrinkage, high transparency, and particularly good storage stability, and further to provide a volume phase hologram recording medium and a volume phase hologram.

The invention claimed is:

1. A photosensitive resin composition for volume phase hologram recording comprising: a soluble aromatic copolymer (A) that has a structural unit of a divinyl aromatic compound and a structural unit of a monovinyl aromatic compound, comprises 10 to 90 mol % of a structural unit represented by the following formula (a1)

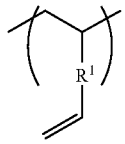

(a1)

where $R^1$ is an aromatic hydrocarbon group of 6 to 30 carbon atoms,
and has a hydroxyl equivalent of 100 to 30,000 g/equiv, a number average molecular weight ($M_n$) of 400 to 30,000, and a molecular weight distribution ($M_w/M_n$) of 10 or less; a photoradically polymerizable compound (B) capable of copolymerizing with the soluble aromatic copolymer (A); a photopolymerization initiator (C); and a polymer binder (D),
wherein the soluble aromatic copolymer (A) accounts for 5 to 60 wt % of the composition.

2. A photosensitive resin composition for volume phase hologram recording as described in claim 1 wherein the soluble aromatic copolymer (A) comprises 10 to 90 mol % of a structural unit represented by the following formula (a2)

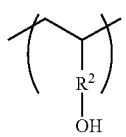

(a2)

where $R^2$ is an aromatic hydrocarbon group of 6 to 30 carbon atoms.

3. A photosensitive resin composition for volume phase hologram recording as described in claim 2 wherein the soluble aromatic copolymer (A) is obtained by cationic polymerization of 20 to 90 wt % of a divinyl aromatic compound and 80 to 10 wt % of an aromatic monoolefinic compound comprising a monovinyl aromatic compound as an essential component in the presence of a hydroxy compound or a precursor thereof capable of providing a hydroxyl group at the end of the copolymer as an initiator and a Lewis acid.

4. A photosensitive resin composition for volume phase hologram recording as described in claim 3 wherein the aromatic monoolefinic compound is a monovinyl aromatic compound or a mixture of the monovinyl aromatic compound and an aromatic olefin selected from indene, acenaphthylene, benzothiophene, and derivatives thereof.

5. An optical information recording medium for volume phase hologram recording comprising a recording layer formed from the photosensitive resin composition for volume phase hologram recording described in claim 4 and disposed on a substrate or between two substrates.

6. An optical information recording medium for volume phase hologram recording comprising a recording layer formed from the photosensitive resin composition for volume phase hologram recording described in claim 3 and disposed on a substrate or between two substrates.

7. An optical information recording medium for volume phase hologram recording comprising a recording layer formed from the photosensitive resin composition for volume phase hologram recording described in claim 2 and disposed on a substrate or between two substrates.

8. A volume phase hologram obtained by recording an interference pattern formed by an energy ray of highly coherent nature on the optical information recording medium described in claim 7.

9. A method of producing a volume phase hologram which comprises exposing an interference pattern formed by an energy ray of highly coherent nature to the optical information recording medium described in claim 7.

10. A photosensitive resin composition for volume phase hologram recording as described in claim 1 wherein the soluble aromatic copolymer (A) is obtained by cationic polymerization of 20 to 90 wt % of a divinyl aromatic compound and 80 to 10 wt % of an aromatic monoolefinic compound comprising a monovinyl aromatic compound as an essential component in the presence of a hydroxy compound or a precursor thereof capable of providing a hydroxyl group at the end of the copolymer as an initiator and a Lewis acid.

11. A photosensitive resin composition for volume phase hologram recording as described in claim 10 wherein the aromatic monoolefinic compound is a monovinyl aromatic compound or a mixture of the monovinyl aromatic compound and an aromatic olefin selected from indene, acenaphthylene, benzothiophene, and derivatives thereof.

12. An optical information recording medium for volume phase hologram recording comprising a recording layer formed from the photosensitive resin composition for volume phase hologram recording described in claim 11 and disposed on a substrate or between two substrates.

13. A volume phase hologram obtained by recording an interference pattern formed by an energy ray of highly coherent nature on the optical information recording medium described in claim 12.

14. A method of producing a volume phase hologram which comprises exposing an interference pattern formed by an energy ray of highly coherent nature to the optical information recording medium described in claim 12.

15. An optical information recording medium for volume phase hologram recording comprising a recording layer formed from the photosensitive resin composition for volume phase hologram recording described in claim 10 and disposed on a substrate or between two substrates.

16. A volume phase hologram obtained by recording an interference pattern formed by an energy ray of highly coherent nature on the optical information recording medium described in claim 15.

17. A method of producing a volume phase hologram which comprises exposing an interference pattern formed by an energy ray of highly coherent nature to the optical information recording medium described in claim 15.

18. An optical information recording medium for volume phase hologram recording comprising a recording layer formed from the photosensitive resin composition for volume phase hologram recording described in claim 1 and disposed on a substrate or between two substrates.

19. A volume phase hologram obtained by recording an interference pattern formed by an energy ray of highly coherent nature on the optical information recording medium described in claim 18.

20. A method of producing a volume phase hologram which comprises exposing an interference pattern formed by an energy ray of highly coherent nature to the optical information recording medium described in claim 18.

* * * * *